US006046633A

United States Patent [19]
Shimizu

[11] Patent Number: 6,046,633
[45] Date of Patent: Apr. 4, 2000

[54] OUTPUT CIRCUIT FREE FROM OVERSHOOT AND UNDERSHOOT ON SIGNAL LINES ALTERNATELY DRIVEN IN POSITIVE POTENTIAL RANGE AND NEGATIVE POTENTIAL RANGE

[75] Inventor: Nobuo Shimizu, Shiga, Japan

[73] Assignee: NEC Corporation, Tokyo, Japan

[21] Appl. No.: 09/217,880

[22] Filed: Dec. 21, 1998

[30] Foreign Application Priority Data

Dec. 22, 1997 [JP] Japan .................................... 9-352574

[51] Int. Cl.[7] ........................................................ H03F 1/14
[52] U.S. Cl. ................................................. 330/51; 330/69
[58] Field of Search ..................................... 330/9, 51, 69

[56] References Cited

U.S. PATENT DOCUMENTS 3,628,129 12/1971 Riley ....................................... 323/100
4,703,283 10/1987 Samuels ..................................... 330/9
5,659,264 8/1997 Ariyoshi et al. ........................ 327/513
5,926,054 7/1999 Friedrich et al. ....................... 327/307

*Primary Examiner*—Benny Lee
*Assistant Examiner*—Henry Choe
*Attorney, Agent, or Firm*—Scully, Scott, Murphy & Presser

[57] ABSTRACT

An output circuit of a liquid crystal display driver has a first operational amplifier fast in potential rise and slow in potential decay and a second operational amplifier fast in potential decay and slow in potential rise both serving as voltage followers, and the first operational amplifier and the second operational amplifier are alternately connected to a data line of a liquid crystal display panel so as to alternate the potential level on the data line between a positive range and a negative range with respect to a reference voltage level on a common electrode of the pixels at changes of horizontal periods, wherein a reset circuit is connected to the first and second operational amplifiers so as to forcibly reset the non-inverted nodes and the output nodes to the reference voltage level in each transient period between the horizontal periods, thereby eliminating undershoot and overshoot due to the slow potential change from the potential waveform on the data line.

10 Claims, 8 Drawing Sheets

OUTPUT CIRCUIT FREE FROM OVERSHOOT AND UNDERSHOOT ON SIGNAL LINES ALTERNATELY DRIVEN IN POSITIVE POTENTIAL RANGE AND NEGATIVE POTENTIAL RANGE

FIELD OF THE INVENTION

This invention relates to an output circuit and, more particularly, to an output circuit for alternately driving signal lines in a positive potential range and a negative potential range.

DESCRIPTION OF THE RELATED ART

A liquid crystal display panel has liquid crystal sandwiched between two substrate structures. One of the substrate structures is fabricated on a glass plate, and pixels electrodes and associated thin film transistors are arranged in matrix. Gate lines and data lines are further patterned on the glass plate. The gate lines are selectively connected to the gate electrodes of the thin film transistors, and the data lines are selectively connected to the drain nodes of the thin film transistors. When a gate line is changed to an active level, the thin film transistors turn on, and the data lines are electrically connected to the associated pixel electrodes.

The other substrate structure is also fabricated on a glass plate, and a common electrode and color filters are formed on the glass plate. The substrate structures are opposed to each other in such a manner that the pixel electrodes are confronted to the common electrode, and the liquid crystal fills the gap between the two substrate structures. Each pixel electrode, the common electrode and a piece of liquid crystal therebetween form a pixel, and plural pixels are arranged in a matrix. The molecules of liquid crystal rise in the presence of electric field between the pixel electrodes and the common electrode. The data lines control the strength of the electric field for each pixel, and make the liquid crystal selectively transparent. The transparent pixels allow back light to pass therethrough, and form an image.

The data lines and the gate lines are controlled by a liquid crystal display driver, and the liquid crystal display driver includes a vertical driver for the gate lines and a horizontal driver for the data lines. The vertical driver sequentially supplies a scanning signal to the gate lines, and the scanning signal causes the thin film transistors to periodically turn on. The horizontal driver supplies data signals to the data lines, and changes the data signals in synchronism with the scanning signal. The data signals control the strength of electric fields between the selected pixel electrodes and the common electrode. While the vertical driver is successively applying the scanning signal from the first gate line to the last gate line, the horizontal driver controls the strength of electric fields for all the pixels, and an image is created on the matrix of pixels. Term "horizontal period" means a time period for keeping each gate line active high. The scanning cycle from the first gate line to the last gate line is called as "frame", and each frame consists of plural horizontal periods.

It is necessary for the horizontal driver to drive the pixels with alternating current from the aspect of the lifetime of the liquid crystal. The horizontal driver inverts the polarity of each pixel electrode in such a manner as to be opposite to the polarity of the adjacent pixels. A horizontal driver 1 is assumed to give the polarity to the pixels 2 of the liquid crystal display panel 3 in a frame as shown in FIG. 1A. Each pixel is opposite in polarity to the adjacent pixels. The pixel 2*a* is, by way of example, negative in polarity, and the adjacent pixels 2*b* are positive. The polarity pattern is achieved as follows. When the vertical driver supplies the scanning signal to the first gate line, the horizontal driver changes the odd data lines in the positive voltage range with respect to a reference voltage Vref (see FIG. 6), and the even data lines in the negative voltage range with respect to the reference voltage Vref. The reference voltage Vref is applied to the common electrode. The vertical driver changes the scanning signal from the first gate line to the next gate line, and the horizontal driver changes the voltage range between the odd data lines and the even data lines. In this way, the horizontal driver alternately changes the voltage range in synchronism with the scanning signal so as to achieve the polarity pattern.

In the next frame, the horizontal driver 1 oppositely changes the polarity of pixels 2 as shown in FIG. 1B. The horizontal driver firstly changes the odd data lines in the negative voltage range and the even data lines in the positive voltage range. The pixel 2*a* is changed to the positive, and the adjacent pixels 2*b* are changed to the negative.

FIG. 2 illustrates a prior art output circuit incorporated in the horizontal driver 1. The prior art output circuit includes operational amplifiers 1*a*/1*b* and a switching unit 1*c*. Signal input terminals 1*c*/1*d* are connected to the non-inverted nodes of the operational amplifiers 1*a*/1*b*, and the output nodes of the operational amplifiers 1*a*/1*b* are directly connected to the inverted nodes thereof. Thus, the operational amplifiers 1*a*/1*b* form voltage followers, respectively.

The switching units has two input nodes 1*e*/1*f* and two output nodes 1*g*/1*h*, and the input nodes 1*e*/1*f* are selectively connected to the output nodes 1*g*/1*h*. The input terminals 1*c*/1*d* are connected to a driving voltage selecting circuit (not shown), and the driving voltage selecting circuit supplies a positive voltage with respect to the reference voltage Vref to the input terminal 1*c* and a negative voltage with respect to the reference voltage Vref to the other input terminal 1*d*. The output nodes of the operational amplifiers 1*a*/1*b* are connected to the input nodes 1*e*/1*f*, respectively, and the output nodes 1*g*/1*h* are respectively connected to an odd data line and an even data line.

A gradation voltage generator (not shown) is connected to the driving voltage selecting circuit, and supplies positive gradation voltages and negative gradation voltages to the driving voltage selecting circuit. The driving voltage selecting circuit is responsive to image carrying signals representative of the image, and selectively supplies one of the positive voltages corresponding to a piece of image and one of the negative voltages corresponding to another piece of image to the input terminals 1*c*/1*d*, respectively.

The switching unit 1*c* is responsive to a control signal CTL1 so as to alternately connect the input nodes 1*e*/1*f* to the output nodes 1*g*/1*h* and to the input nodes 1*f*/1*e* in synchronism with the change of gate lines. Thus, the positive voltage and the negative voltage are alternately supplied to the odd data line and the even data line.

The operational amplifier 1*a* has the circuit configuration shown in FIG. 3. The operational amplifier 1*a* is broken down into a differential amplifier 1*j*, an output driver 1*k* and a bias voltage source 1*m*. The bias voltage source 1*m*. sets a limit of operation range to the differential amplifier 1*j* and the output driver 1*k*, and the differential amplifier 1*j* and the output driver 1*k* generate a voltage level approximately equal to the voltage level at the non-inverted node.

The differential amplifier 1*j* includes two p-channel enhancement type field effect transistors and three n-channel enhancement type field effect transistors Qn1/Qn2/Qn3. The p-channel enhancement type field effect transistors Qp1/Qp2 are connected in series to the n-channel enhancement type field effect transistors Qn1/Qn2, respectively, and the two series combinations Qp1/Qn1 and Qp2/Qn2 are connected between a positive power supply line Vcc and a common node N1. The drain node of the p-channel enhancement type field effect transistor Qp1 is connected to the gate electrodes of the p-channel enhancement type field effect transistors Qp1/Qp2, and the inverted node and the non-inverted nodes are respectively connected to the gate electrodes of the n-channel enhancement type field effect transistors Qn1/Qn2. The n-channel enhancement type field effect transistor Qn3 is connected between the common node N1 and a ground line GND, and the bias voltage source 1*m* supplies a positive voltage to the gate electrode of the n-channel enhancement type field effect transistor Qn3.

When the common node N1 is higher than a certain positive voltage level, the n-channel enhancement type field effect transistor Qn3 flows current I1 from the common node N1 to the ground line GND, and the n-channel enhancement type field effect transistors Qn1/Qn2 and the p-channel enhancement type field effect transistors Qp1/Qp2 are responsive to the potential difference between the inverted node and the non-inverted node for varying the potential level at the common drain node N2.

A series combination of a p-channel enhancement type field effect transistor Qp3 and an n-channel enhancement type field effect transistor Qn4 form the output driver 1*k*. The gate electrode of the p-channel enhancement type field effect transistor Qp3 is connected to the common drain node N2 between the p-channel enhancement type field effect transistor Qp2 and the n-channel enhancement type field effect transistor Qn2, and the bias voltage source 1*m* supplies the positive voltage to the gate electrode of the n-channel enhancement type field effect transistor Qn4. The common drain node N3 between the p-channel enhancement type field effect transistor Qp3 and the n-channel enhancement type field effect transistor Qn4 serves as the output node of the operational amplifier 1*a*.

When the potential level at the common drain node N3 is higher than the certain positive voltage, the n-channel enhancement type field effect transistor Qn4 flows current I2 from the common drain node N3 to the ground line GND, and the p-channel enhancement type field effect transistor Qp3 varies the potential level at the common drain node N3 inversely to the potential level at the common drain node N2.

As described hereinbefore, the output node of the operational amplifier 1*a* is connected to the inverted node, and the differential amplifier 1*j* and the output driver 1*k* form the voltage follower. The differential amplifier 1*j* and the output driver 1*k* regulate the potential level at the common drain node N3 to the potential level at the non-inverted node.

The operational amplifier 1*a* is expected to drive a capacitive load connected to the odd data line. The selected pixel 2, i.e., a piece of liquid crystal between the pixel electrode and the common electrode offers the capacitive load. Although the output driver 1*k* rapidly raises the potential level at the odd data line, the potential fall on the odd data line is slower than the potential rise. In detail, when the driving voltage driving circuit gives rise to increase the potential level at the non-inverted node, the n-channel enhancement type field effect transistor Qn2 increases the channel conductance, and pulls down the potential difference at the common drain node N2. Although the n-channel enhancement type field effect transistor Qn4 keeps the channel conductance constant, the p-channel enhancement type field effect transistor Qp3 increases the channel conductance and, accordingly, the amount of current passing therethrough. The current is branched from the common drain node N3 into the odd data line, and is rapidly accumulated in the capacitive load. Thus, the potential rise at the non-inverted node gives rise to rapid increase of the potential level on the odd data line.

On the other hand, when the potential level at the non-inverted node falls down, the n-channel enhancement type field effect transistor Qn2 decreases the channel conductance and, accordingly, raises the potential level at the common drain node N2. As a result, the p-channel enhancement type field effect transistor Qp3 decreases the channel conductance and, accordingly, the amount of current flowing into the common drain node N3. The capacitive load discharges the electric charge to the odd data line, and the electric charge flows through the common drain node N3 into the n-channel enhancement type field effect transistor Qn4. Although the n-channel enhancement type field effect transistor Qn4 is expected to discharge not only the current passing through the p-channel enhancement type field effect transistor Qp3 but also the electric charge from the capacitive load, the amount of current I2 is constant, and the potential level on the odd data line slowly goes down. Thus, the operational amplifier 1*a* is fast in potential rise and low in potential fall.

On the other hand, the other operational amplifier 1*b* has a circuit configuration different from that of the operational amplifier 1*a*. FIG. 4 illustrates the circuit configuration of the other operational amplifier 1*b*. The operational amplifier is also broken down into a differential amplifier 1*n*, an output driver 1*p* and a bias voltage source 1*q*. The output driver 1*p* and the bias voltage source 1*q* are similar to those of the operational amplifier 1*a*, and the differential amplifier 1*n* is different in circuit configuration from the differential amplifier 1*j*.

The differential amplifier 1*n* includes a p-channel enhancement type field effect transistor Qp4 connected between the positive power supply line Vcc and a common node N4, a series combination of a p-channel enhancement type field effect transistor Qp5 and an n-channel enhancement type field effect transistor Qn4 connected between the common node N4 and the ground line GND and a series combination of a p-channel enhancement type field effect transistor Qp6 and an n-channel enhancement type field effect transistor Qn5 connected in parallel to the series combination. The inverted node and the non-inverted node are connected to the gate electrode of the p-channel enhancement type field effect transistor Qp5 and the gate electrode of the p-channel enhancement type field effect transistor Qp5, respectively, and the drain node of the n-channel enhancement type field effect transistor Qn4 is connected to the gate electrodes of the n-channel enhancement type field effect transistors Qn4/Qn5.

The differential amplifier 1*n* and the output driver 1*p* form the voltage follower, and regulates the potential level at the common drain node N3 to the potential level at the non-inverted node. Although the circuit behavior of the operational amplifier 1*b* is omitted from the following description, the operational amplifier 1*b* slowly raises the potential level on the even data line, and rapidly decays the potential level on the even data line. Thus, the operational amplifier 1*b* is fast in potential fall and slow in potential rise.

Turning to FIG. 5, the horizontal periods A, B and C are defined between time t1 and time t2, between time t2 and time t3 and between time t3 and time t4, respectively. In the following description, "high" voltage level is spaced from the reference voltage Vref rather than "low" voltage level in the positive voltage range. On the other hand, "high" voltage level is closer to the reference voltage Vref than "low" voltage level in the negative voltage range.

The driving voltage selecting circuit (not shown) changes the input terminal 1*c* and the other input terminal 1*d* to a positive voltage higher than that in the previous horizontal period and a negative voltage also higher than that in the previous horizontal period at time t1, and keeps the input terminal 1*c* and the other input terminal 1*d* at the positive voltage and the negative voltage in the horizontal period A. Subsequently, the driving voltage selecting circuit (not shown) pulls down the positive voltage and the negative voltage in the horizontal period B, and pulls up the positive voltage and the negative voltage in the horizontal period C as shown.

As described hereinbefore, the operational amplifier 1*a* is fast in potential rise, and the other operational amplifier 1*b* is slow in potential rise. For this reason, the operational amplifier 1*a* raises the potential level at the output node thereof at high speed in the horizontal periods A and C, and the other operational amplifier 1*b* rapidly decays the potential level at the output node thereof in the horizontal period B. However, the operational amplifier 1*a* slowly decays the potential level at the output node thereof in the horizontal period B, and the other operational amplifier 1*b* slowly raises the potential level at the output node thereof in the horizontal periods A and C.

The switching unit 1*c* connects the operational amplifier 1*b* through the output node 1*g* to the odd data line in the horizontal period A, changes the operational amplifier connected to the odd data line from 1*b* to 1*a* in the horizontal period B, and changes the operational amplifier connected to the odd data line from 1*a* to 1*b*. The even data line is connected through the output node 1*h* to the operational amplifier 1*a* in the horizontal periods A and C, and to the other operational amplifier 1*b* in the horizontal period B.

In this control sequence, an undershoot US1 takes place at the output node 1*g* or on the odd data line in the horizontal period A due to the slow potential rise R1 at the output node of the operational amplifier 1*b*, an overshoot OS1 takes place in the horizontal period B due to the low potential fall F1 at the output node of the operational amplifier 1*a*, and an undershoot US2 takes place in the horizontal period C due to the low potential rise R2 at the output node of the operational amplifier 1*b*. However, any overshoot and any undershoot do not take place at the output node 1*f* or on the even data line, because the fast potential rise and the fast potential falls form the waveform at the output node 1*f*.

Thus, a problem is encountered in the prior art output circuit in the over-shoot and the undershoot on the odd data lines. The overshoot and the under-shoot are causative of deterioration of the image produced on the matrix of pixels.

SUMMARY OF THE INVENTION

It is therefore an important object of the present invention to provide an output circuit, which eliminates an undershoot and an overshoot from signal lines to be driven regardless of the output characteristics of component operational amplifiers.

To accomplish the object, the present invention proposes to forcibly reset the potential level at the non-inverted nodes and the output nodes of operational amplifiers without the low-speed potential decay and the low-speed potential rise.

In accordance with one aspect of the present invention, there is provided an output circuit comprising a first operational amplifier including a first output node, a first non-inverted node supplied with a positive potential level with respect to a reference voltage and a first inverted node connected to the first output node, regulating the potential level at the first output node to the potential level at the first non-inverted node through a differential amplification between the first inverted node and the first non-inverted node and having first voltage regulating characteristics fast in potential rise at the first output node and slow in potential decay at the first output node, a second operational amplifier including a second output node, a second non-inverted node supplied with a negative voltage with respect to the reference voltage and a second inverted node connected to the second output node, regulating the potential level at the second output node to the potential level at the second non-inverted node through a differential amplification between the second inverted node and the second non-inverted node and having second voltage regulating characteristics fast in potential decay at the second output node and slow in potential rise at the second output node, a first switching unit having first input nodes respectively connected to the first output node and the second output node, a third output node and a fourth output node and alternately connecting each of the first input nodes to the third output node and the fourth output node, and a reset circuit provided for the first operational amplifier and the second operational amplifier and forcibly resetting the first non-inverted node, the second non-inverted node, the first output node and the second output node to the reference voltage when the first switching unit changes the connections between the first input nodes and the third and fourth output nodes.

BRIEF DESCRIPTION OF THE DRAWINGS

The features and advantages of the output circuit will be more clearly understood from the following description taken in conjunction with the accompanying drawings in which.

DESCRIPTION OF THE PREFERRED EMBODIMENTS

First Embodiment

Figure 6:
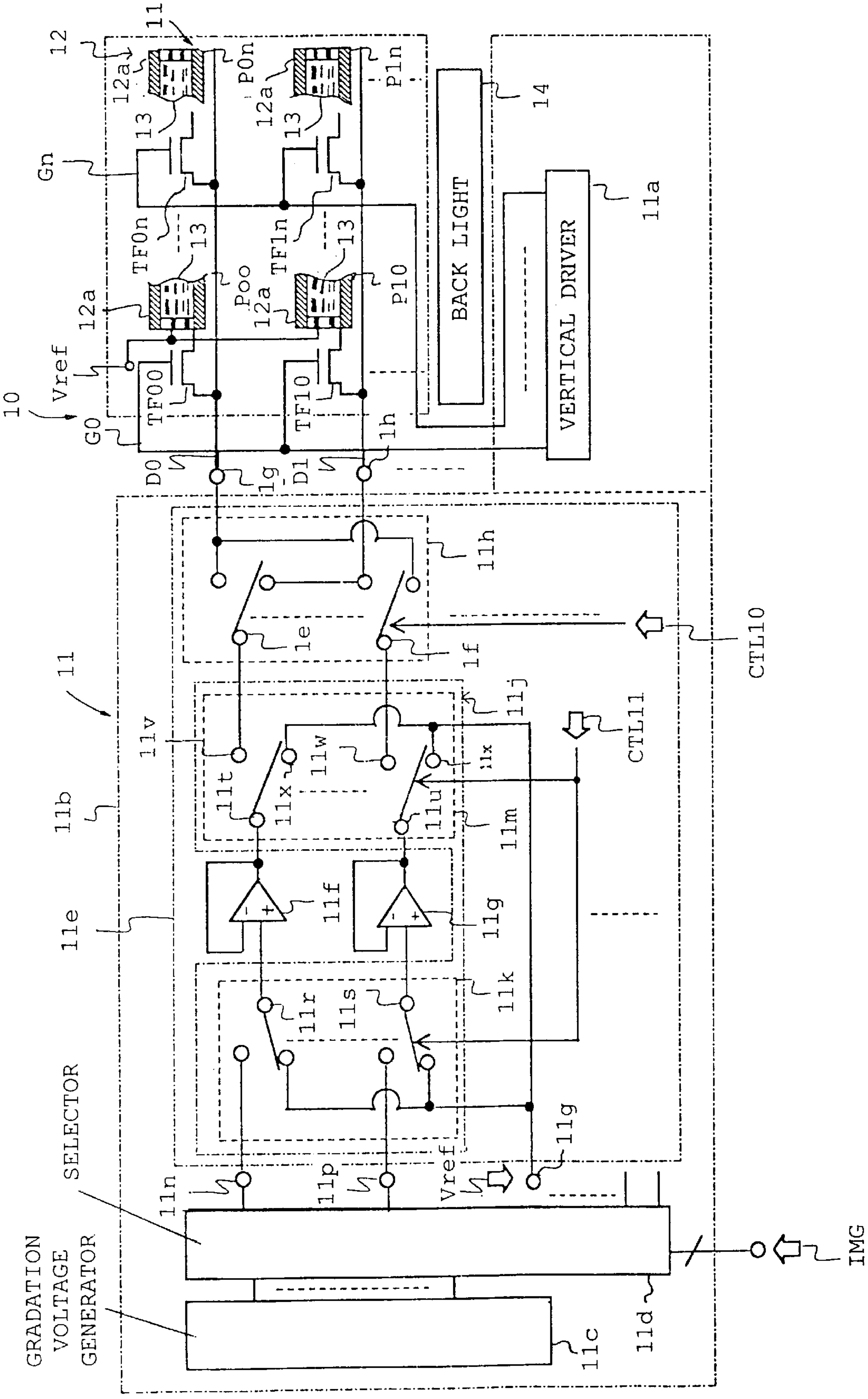
FIG. 6 is a circuit diagram showing the circuit configuration of an output circuit according to the present invention.

Referring to FIG. 6 of the drawings, a liquid crystal display panel 10 is controlled by a liquid crystal display driver 11. The liquid crystal display panel 10 comprises a first substrate structure 19, a second substrate structure 12, liquid crystal sandwiched between the first substrate structure 19 and the second substrate structure 12 and a back light 14. The liquid crystal display driver 11 supplies a scanning signal and data signals to the first substrate structure 19, and produces an image from an image carrying signal IMG in each frame.

The first substrate structure 19 includes thin film transistors TF00, . . . , TF0n, TF10 . . . TF1n . . . , pixel electrodes P00, . . . , P0n, P10 . . . P1n, . . . , gate lines G0 to Gn and data lines D0, D1, . . . , and the thin film transistors TF00 to TF1n . . . , the pixel electrodes P00 to P1n . . . , the gate lines G0 to Gn and the data lines D0, D1 . . . are formed on a transparent glass plate (not shown). The pixel electrodes P00 to P1n . . . are arranged in rows and columns, and the thin film transistors TF00 to TF1n . . . are respectively connected to the pixel electrodes P00 to P1n . . . The gate lines G0 to Gn are respectively associated with the columns of pixel electrodes P00, P10 . . . , . . . and P0n, P1n . . . , and the data lines D0 to D1 are respectively associated with the rows of pixel electrodes P00 to P0n, P10 to P1n . . . . The gate lines G0 to Gn are connected to the gate electrodes of the thin film transistors TF00, TF10 . . . , . . . and TF0n, TF1n . . . , respectively, and the data lines D0, D1, . . . are connected to the drain nodes of the thin film transistors TF00 to TF0n, TF10 to TF1n, . . . , respectively. Each odd data line such as D0 is paired with the next data line D1, and the data lines D0, D1, . . . form pairs of data lines.

The second substrate structure 12 includes a common electrode 12*a* and sets of color filters (not shown), and the common electrode 12*a* and the sets of color filters are fabricated on a transparent glass plate. The first substrate structure 19 and the second substrate structure 12 are spaced from each other, and liquid crystal 13 fills the gap between the first substrate structure 19 and the second substrate structure 12. Each pixel electrode, a part of the common electrode 12*a*, a set of color filters and a piece of liquid crystal form one of the pixels, and an image is produced on the array of pixels in each frame.

The liquid crystal display driver 11 largely comprises a vertical driver 11*a* and a horizontal driver 11*b*. The vertical driver 11*a* repeatedly supplies a scanning signal to the gate lines G0 to Gn in a predetermined order, and the scanning signal sequentially raises the gate lines G0 to Gn to go up to active level. The gate line at the active level causes the associated thin film transistors to turn on, and the associated pixel electrodes are electrically connected to the data lines D0, D1, . . . .

The horizontal driver 11*b* includes a gradation voltage generator 11*c*, a selector 11*d* and output circuits 11*e*. The gradation voltage generator 11*c* generates two sets of voltage levels. The first set of voltage levels is higher than a reference voltage Vref, and the voltage levels are different in magnitude from one another. These voltage levels form a positive voltage range higher than the reference voltage Vref, and the voltage levels in the positive voltage range are hereinbelow referred to as "positive voltage levels". The second set of voltage levels is lower than the reference voltage Vref, and the voltage levels are also different in magnitude from one another. These voltage levels form a negative voltage range lower than the reference voltage Vref, and the voltage levels in the negative voltage range are hereinbelow referred to as "negative voltage levels". The two sets of voltage levels are supplied to the selector 11*d*.

The selector 11*d* is responsive to the image carrying signal IMG representative of an image to be produced in each frame. The image carrying signal IMG causes the selector to supply a positive voltage level and a negative voltage level through each output circuit 11*e* to associated one of the pairs of data lines such as D0/D1.

The output circuits 11*e* are similar to one another, and description is focused on one of the output circuits 1*e* associated with the pair of data lines D0/D1. The output circuit 11*e* includes two operational amplifiers 11*f*/11*g*, a switching unit 11*h* and a reset circuit 11*j*. The operational amplifiers 11*f*/11*g* serve as voltage followers, respectively. The operational amplifier 11*f* has the circuit configuration shown in FIG. 3, and is fast in potential rise and slow in potential fall. On the other hand, the other operational amplifier 11*g* has the circuit configuration shown in FIG. 4, and is fast is potential fall and slow in potential rise.

Figure 1A:
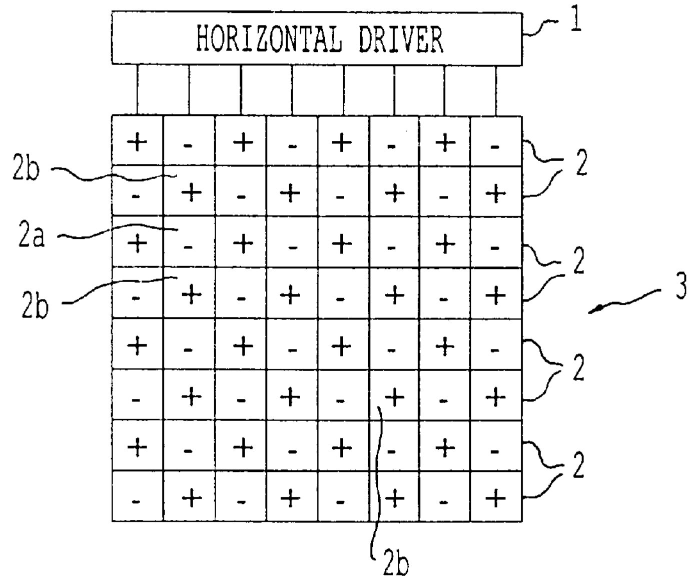
FIG. 1A (Prior Art)
FIGS. 1A and 1B are schematic views showing the polarity pattern on the matrix of pixels in a frame and the next frame.
Figure 1B:
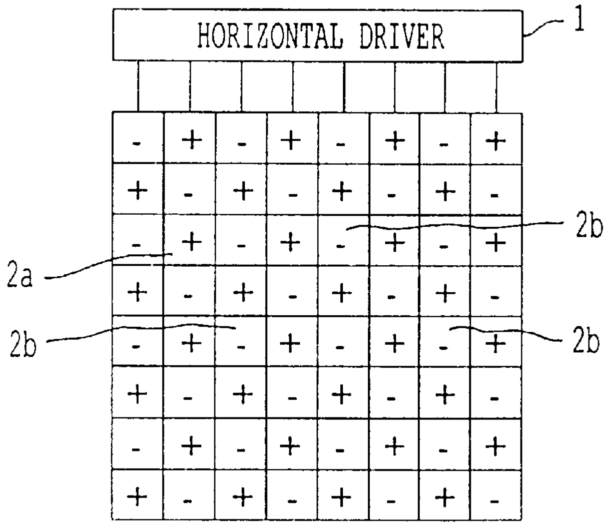
FIG. 1B (Prior Art)
Figure 2:
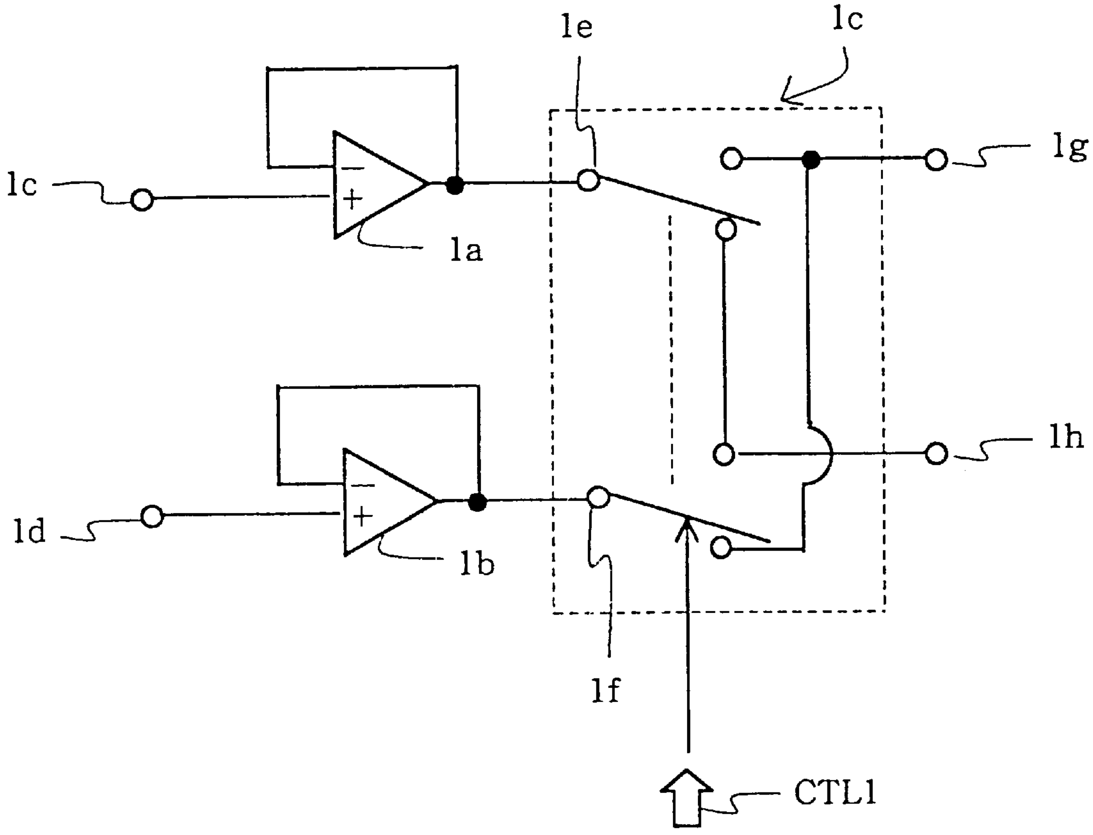
FIG. 2 (Prior Art)
FIG. 2 is a circuit diagram showing the circuit configuration of the prior art output circuit incorporated in the horizontal driver.

The switching unit 11*h* is similar in circuit configuration to the switching unit 1*c*, and nodes of the switching unit 11*h* are labeled with the same references designating corresponding nodes of the switching unit 1*c* without detailed description. The connections between the input nodes 1*e*/1*f* and the output nodes 1*g*/1*h* are alternated at each change from one gate line to the next gate line, i.e., each horizontal period HP. As a result, the pixel electrodes P00–P0n, P10–P1n, . . . are alternately applied with the positive potential range and the negative potential range as shown in FIGS. 1A and 1B.

The reset circuit 11*j* includes two switching units 11*k*/11*m*, one of which is connected between the selector 11*d* and the operational amplifiers 11*f*/11*g* and the other of which is connected between the operational amplifiers 11*f*/11*g* and the switching unit 11*h*. Each horizontal period HP contains a reset sub-period RST, and the switching units 11*k*/11*m* supply the reference voltage Vref to the operational amplifiers 11*f*. 11*g* in the reset sub-period RST. The horizontal period HP ranges from 15 microseconds to 30 microseconds, and the reset sub-period RST is of the order of 1 microsecond to 2 microseconds. Thus, the reset sub-period RST is less than 15 percent of the horizontal period HP.

The switching unit 11*k* has two input nodes 11*n*/11*p*, a reset node 11*q* and two output nodes 11*r*/11*s*. The positive voltage levels and the negative voltage levels are selectively supplied through the selector 11*d* to the input nodes 11*n*/11*p*, and the reference voltage Vref is supplied to the reset node 11*q*. On the other hand, the output nodes 11*r*/11*s* are respectively connected to the non-inverted nodes of the operational amplifiers 11*f*/11*g*. The switching unit 11*k* is responsive to a control signal CTL11 for selectively connecting the input nodes 11*n*/11*p* and the reset node 11*q* to the non-inverted nodes of the operational amplifiers 11*f*/11*g*. When the output circuit 11*e* enters into the reset sub-period RST, the switching unit 11*k* connects the reset node 11*q* to the non-inverted node of the operational amplifiers 11*f*/11*g*, and the non-inverted nodes are reset to the reference voltage Vref. After the reset sub-period RST, the switching unit 11*k* connects the input nodes 11*n*/11*p* to the non-inverted nodes of the operational amplifiers 11*f*/11*g*, and the positive voltage level and the negative voltage level are supplied to the non-inverted node of the operational amplifier 11*f* and the non-inverted node of the other operational amplifier 11*g*, respectively.

The switching unit 11*m* has two input nodes 11*t*/11*u*, two output nodes 11*v*/11*w* and a reset node 11*x*. The input nodes 11*t*/11*u* are respectively connected to the output nodes of the operational amplifiers 11*f*/11*g*, and the output nodes 11*v*/11*w* are connected to the input nodes 11*e*/11*f* of the switching unit 11*h*. The reference voltage Vref is supplied to the reset node 11*x*.

The switching unit 11*m* is also responsive to the control signal CTL11, and selectively connects the input nodes 11*t*/11*u* to the output nodes 11*v*/11*w* and the reset node 11*x*. When the output circuit 11*e* enters into the reset sub-period RST, the switching unit 11*m* connects the reset node 11*x* to the non-inverted node of the operational amplifiers 11*f*/11*g* and the non-inverted nodes are reset to the reference voltage Vref. After the reset sub-period RST, the switching unit 11*m* connects the input nodes 11*t*/11*u* through the output nodes 11*v*/11*w* to the input nodes 1*e*/1*f* of the switching unit 11*h*, and the positive voltage and the negative voltage are selectively supplied from the non-inverted nodes of the operational amplifiers 11*f*/11*g* through the switching units 11*m*/11*h* to the data lines D0/D1.

Figure 7:
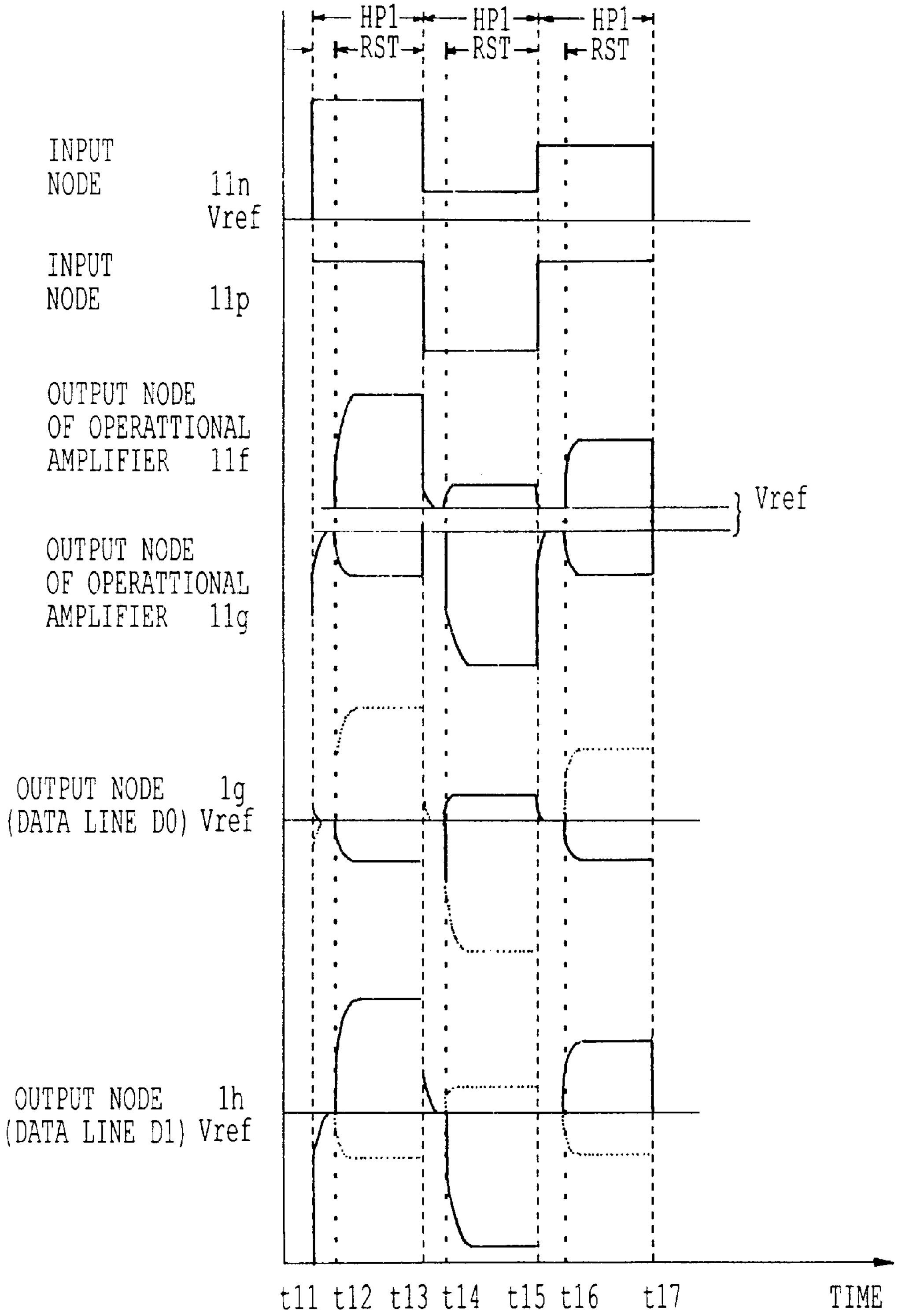
FIG. 7 is a timing chart showing the circuit behavior of the output circuit shown in FIG. 6.

The output circuit 1*e* behaves as shown in FIG. 7. In the following description, "high" voltage level is spaced from the reference voltage Vref rather than "low" voltage level in the positive voltage range, and "high" voltage level is closer to the reference voltage Vref than "low" voltage level in the negative voltage range. The horizontal period HP1 is continued from time t11 to time t13, the next horizontal period HP2 from time t13 to time t15, the next horizontal period HP3 from time t15 to time t17.

The selector 11*d* changes the input terminal 11*n* and the other input terminal 11*p* to a positive voltage level and a negative voltage level at time t11, and keeps the input terminal 11*n* and the other input terminal 11*d* at the positive voltage and the negative voltage in the horizontal period HP1. Subsequently, the selector 11*d* pulls down the input terminal 11*n* from the positive voltage to a positive voltage lower than the previous positive voltage, and also pulls down the other input terminal 11*p* from the negative voltage to a negative voltage lower than the previous negative voltage in the horizontal period HP2. The selector 11*d* pulls up the input terminal 11*n* from the positive voltage to a positive voltage higher than the previous positive voltage, and the other input terminal 11*p* from the negative voltage to a negative voltage higher than the previous negative voltage in the horizontal period HP3 as shown.

The control signal CTL11 causes the switching units 11*k*/11*m* to connect the reset nodes 11*q*/11*x* to the non-inverted nodes and the output nodes of the operational amplifiers 11*f*/11*g* at time t11. Although the operational amplifier 11*g* is slow in potential rise, the non-inverted node and the output node of the operational amplifier 11*g* are forcibly reset to the reference voltage in the reset sub-period RST, and, thereafter, the operational amplifier 11*g* rapidly decays the potential level at the output node thereof through the high-speed potential decay. The operational amplifier 11*f* is fast in potential rise, and rapidly raises the potential level at the output node thereof through the high-speed potential rise. Thus, the operational amplifier 11*g* is not required to regulate the potential level at the output node to the potential level at the non-inverted node through the low-speed potential rise in the horizontal period HP1.

The control signal CTL11 causes the switching units 11*k*/11*m* to forcibly reset the non-inverted nodes and the output nodes of the operational amplifiers 11*f*/11*g* at time t13, and the operational amplifiers 11*f*/11*g* rapidly changes the output nodes thereof to the reference voltage Vref. After the reset sub-period RST, the operational amplifier 11*f* raises the potential level at the output node thereof to the next positive voltage level through the high speed potential rise, and the other operational amplifier 11*g* decays the potential level at the output node thereof through the high-speed potential decay. Thus, the operational amplifier 11*f* is not required to regulate the potential level at the output node to the potential level at the non-inverted node through the low-speed potential fall in the horizontal period HP2.

The control signal CTL11 causes the switching units 11*k*/11*m* to forcibly reset the non-inverted nodes and the output nodes of the operational amplifiers 11*f*/11*g* to the reference voltage Vref at time t15. After the reset sub-period RST, the operational amplifier 11*f* raises the potential level at the output node through the high-speed potential rise, and the operational amplifier 11*g* decays the potential level at the output node thereof through the high-speed potential decay. Thus, the operational amplifier 11*g* is not required to raise the potential level at the output node through the low-speed potential rise in the horizontal period HP3.

The switching unit 11*h* connects the operational amplifier 11*g* through the output node 1*g* to the odd data line D0 in the horizontal period HP1, the other operational amplifier 11*f* to the odd data line D0 in the horizontal period HP2, and the operational amplifier 11*g* to the odd data line D0 in the horizontal period HP3. On the other hand, the even data line D1 is connected through the output node 1*h* to the operational amplifier 11*f* in the horizontal periods HP1 and HP3, and to the other operational amplifier 11*g* in the horizontal period HP2. For this reason, the odd data line D0 is altered to the negative voltage level in the horizontal period HP1, to the positive voltage level in the next horizontal period HP2 and to the negative voltage level in the next horizontal period HP3. The even data line D1 is altered to the positive voltage level in the horizontal period HP1, to the negative voltage level in the horizontal period HP2 and to the positive voltage level in the horizontal period HP3. The odd data line D0 and the even data line D1 are maintained at the reference voltage level Vref in the reset sub-periods RST, and are rapidly pulled up and pulled down through the high-speed potential rise and the high-speed potential decay. Thus, the operational amplifiers 11*f*/11*g* changes the odd data line D0 and the even data line D1 between the positive potential level and the negative potential level through the high-speed potential rise and the high-speed potential decay, only. For this reason, any undershoot and any overshoot do not take place in the waveform on every data line D0/D1.

As will be appreciated from the foregoing description, the reset circuit forcibly changes the non-inverted nodes and the output nodes of the operational amplifiers 11*f*/11*g* before the potential alternation on the data lines D0/D1, and, thereafter, the data lines D0/D1 are selectively pulled up and down through the high-speed potential rise and the high-speed potential decay. Thus, the low-speed potential rise and the low-speed potential decay do not participate the potential alternation on the data lines D0/D1, and, for this reason, the undershoot and the overshoot are eliminated from the potential waveforms on the data lines D0/D1.

Second Embodiment

Figure 8:
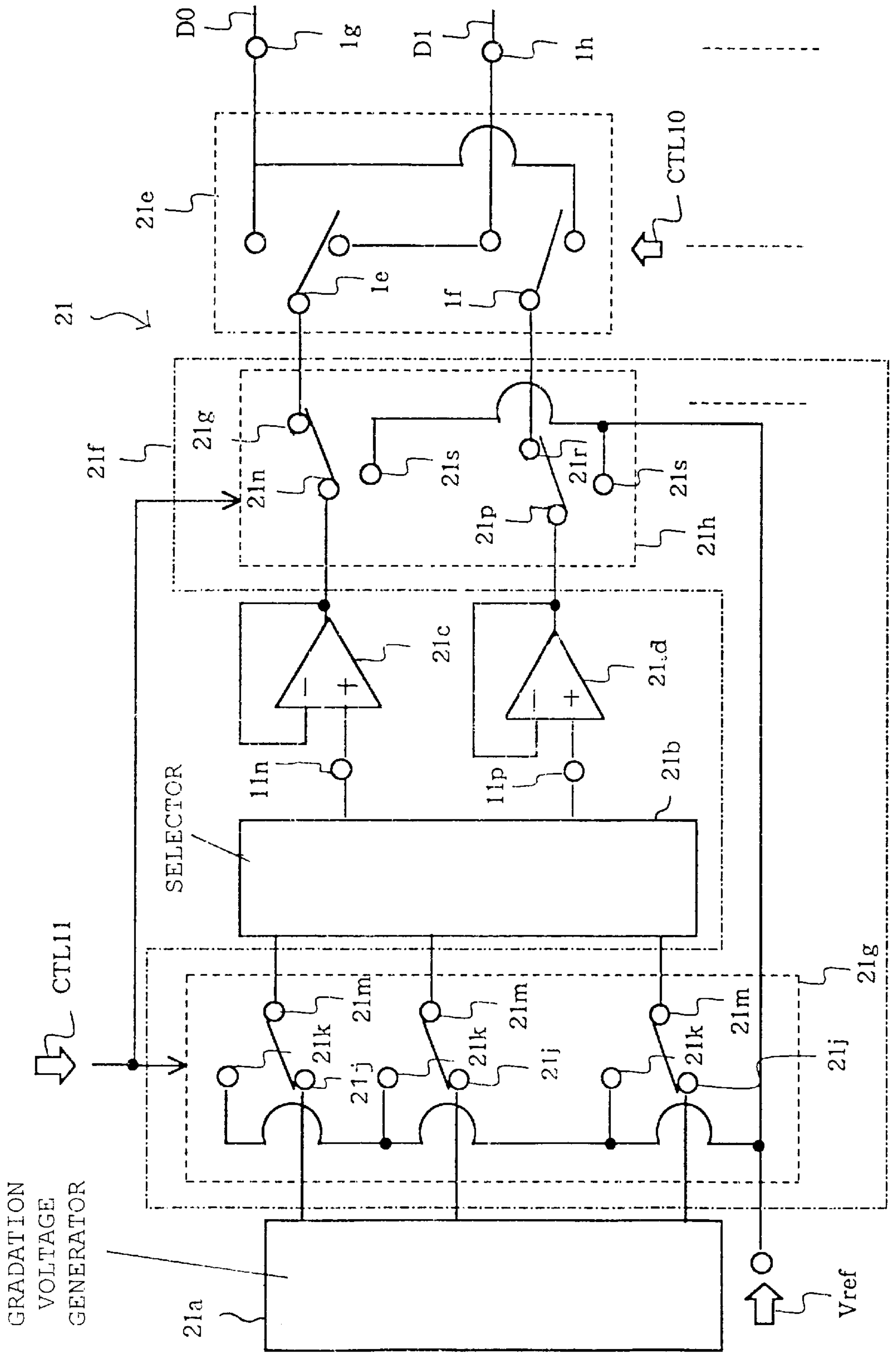
FIG. 8 is a circuit diagram showing the circuit configuration of another output circuit according to the present invention.

FIG. 8 illustrates another output circuit 21 embodying the present invention. The output circuit 21 forms a part of the horizontal driver, and the horizontal driver and a vertical driver (not shown) constitute a liquid crystal display driver connected to a liquid crystal display panel. The liquid crystal display panel and the vertical driver are similar to those of the first embodiment, and, for this reason, no further description is incorporated hereinbelow.

The output circuit 21 comprises a gradation voltage generator 21*a*, a selector 21*b*, operational amplifiers 21*c*/21*d*, a switching unit 21*e* and a reset circuit 21*f*. The gradation voltage generator 21*a*, the selector 21*b*, the operational amplifier 21*c*, the other operational amplifier 21*d* and the switching unit 21*e* are similar to the gradation voltage generator 11*c*, the selector 11*d*, the operational amplifier 11*f*, the other operational amplifier 11*g* and the switching unit 11*h*, respectively, and are not detailed hereinbelow for the sake of simplicity.

The reset circuit 21*f* is different from the reset circuit 11*j*. Although two switching units 21*g*/21*h* are incorporated in the reset circuit 21*f*, the switching unit 21*g* is connected between the gradation voltage generator 21*a* and the selector 21*b*, and the other switching unit 21*h* is connected between the output nodes of the operational amplifiers 21*c*/21*d* and the input nodes 1*e*/1*f* of the switching unit 21*e*. The switching unit 21*g* has input nodes 21*k*, reset nodes 21*k* and output nodes 21*m*. The input nodes 21*j* are respectively connected to the output nodes of the gradation voltage generator 21*a*, and the output nodes 21*m* are respectively connected to the input nodes of the selector 21*b*. The reference voltage Vref is supplied to the reset nodes 21*k*. The switching unit 21*g* is responsive to the control signal CTL11, and connects the output nodes 21*m* to the input nodes 21*j* or the reset nodes 21*k*.

The other switching unit 21*f* has input nodes 21*h*/21*p*, output nodes 21*q*/21*r* and reset nodes 21*s*. The input nodes 21*n*/21*p* are respectively connected to the output nodes of the operational amplifiers 21*c*/21*d*, and the output nodes 21*q*/21*r* are connected to the input nodes 1*e*/1*f* of the switching unit 21*e*. The reference voltage level Vref is supplied to the reset nodes 21*s*. The switching unit 21*h* is responsive to the control signal CTL11, and connects the input nodes 21*h*/21*p* to the output nodes 21*q*/21*r* or the reset nodes 21*s*.

Figure 9:
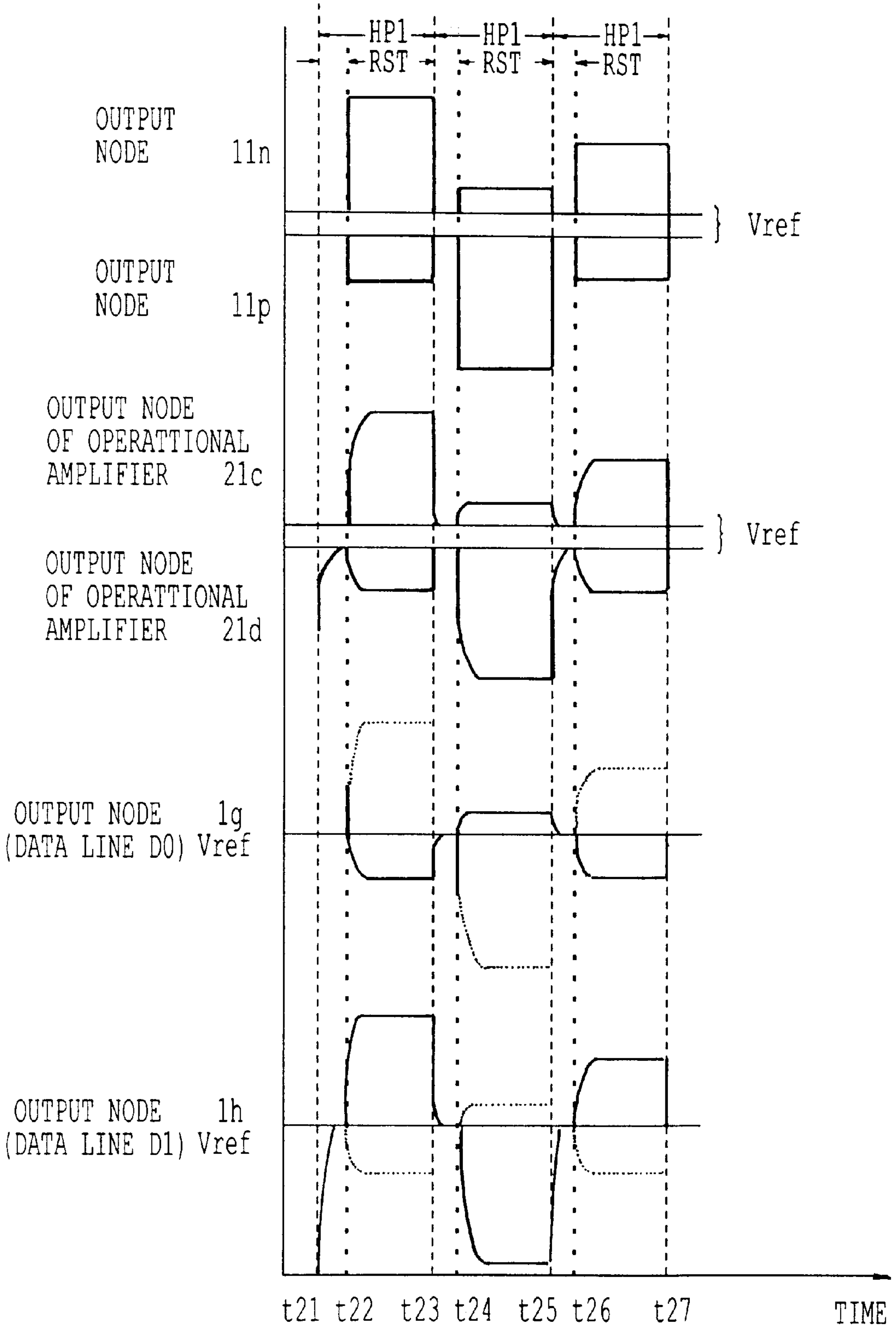
FIG. 9 is a timing chart showing the circuit behavior of the output circuit shown in FIG. 8.

The horizontal driver behaves as shown in FIG. 9. The horizontal periods HP1, HP2 and HP3 are continued from time t21 to time 23, from time t23 to time t25 and from time t25 to time t27. The control signal CTL11 causes the switching units 21*g*/21*h* to supply the reference voltage level Vref through the selector 21*b* to the input terminals 11*n*/11*p*, and defines the reset sub-period RST from time t21 to time t22 in the horizontal period HP1, from time t23 to time t24 in the horizontal period HP2 and from time t25 to time t26 in the horizontal period HP3. The reference voltage Vref is relayed from the input terminals 11*n*/11*p* to the non-inverted nodes of the operational amplifiers 21*c*/21*d*. The control signal CTL11 further causes the switching unit 21*h* to connect the reset node 21*s* to the input nodes 21*n*/21*p*, and the reference voltage Vref is supplied to the output nodes of the operational amplifiers 21*c*/21*d*. Thus, the non-inverted nodes and the output nodes of the operational amplifiers 21*c*/21*d* are forcibly reset to the reference voltage level Vref in the reset sub-period RST.

After the reset sub-period RST, the switching units 21*g* selectively connects the input nodes 21*k* through the selector 21*b* to the input terminals 11*n*/11*p*, and the switching unit 21*h* connects the output nodes of the operational amplifiers 21*c*/21*d* to the input nodes 1*e*/1*f* of the switching unit 21*e*. Although the sense amplifier 21*c* is slow in potential decay, the potential level at the output node rapidly goes down through the reset action, and is never decayed through the low-speed potential decay. On the other hand, the sense amplifier 21*d* is slow in potential rise. However, the potential level at the output node rises through the high-speed reset action, and is never raised through the low-speed potential rise. For this reason, the waveforms at the output nodes of the operational amplifiers 21*c*/21*d* have sharp leading edges and sharp trailing edges.

In this situation, even though the switching unit 21*h* alters the connections between the operational amplifiers 21*c*/21*d* ad the data lines D0/D1 at time t21, time t23 and time t25, the undershoot and the overshoot never take place in the potential waveforms on the data lines D0/D1.

As will be appreciated from the foregoing description, the reset action eliminates the slow potential decay and the slow potential rise from the operational amplifiers 21*c*/21*d*, and makes the edges of the potential waveforms at the output nodes of the operational amplifiers 21*c*/21*d* sharp. For this reason, the potential waveforms on the data lines D0/D1 do not contain any undershoot and any overshoot, and a clear image is produced on the liquid crystal display panel.

Although particular embodiments of the present invention have been shown and described, it will be apparent to those skilled in the art that various changes and modifications may be made without departing from the spirit and scope of the present invention.

For example, the liquid crystal display panel has a different structure from that described in connection with the first embodiment.

Figure 3:
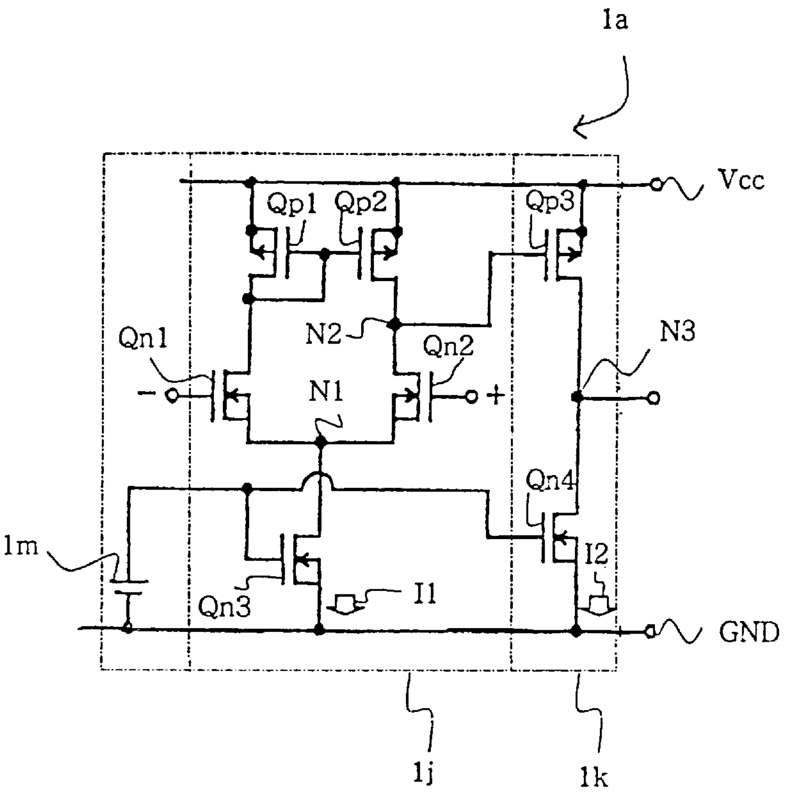
FIG. 3 (Prior Art)
FIG. 3 is a circuit diagram showing the circuit configuration of the operational amplifier incorporated in the prior art output circuit.
Figure 4:
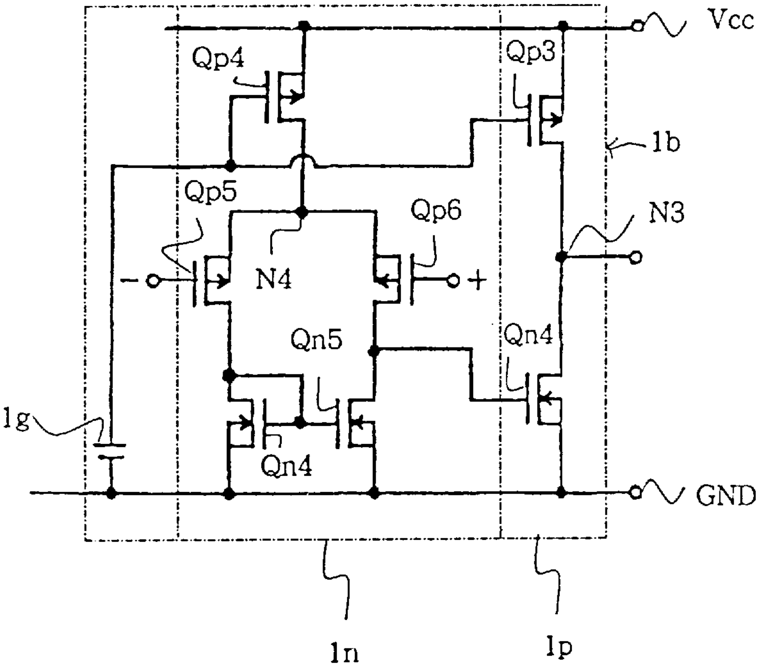
FIG. 4 (Prior Art)
FIG. 4 is a circuit diagram showing the circuit configuration of the other operational amplifier incorporated in the prior art output circuit.
Figure 5:
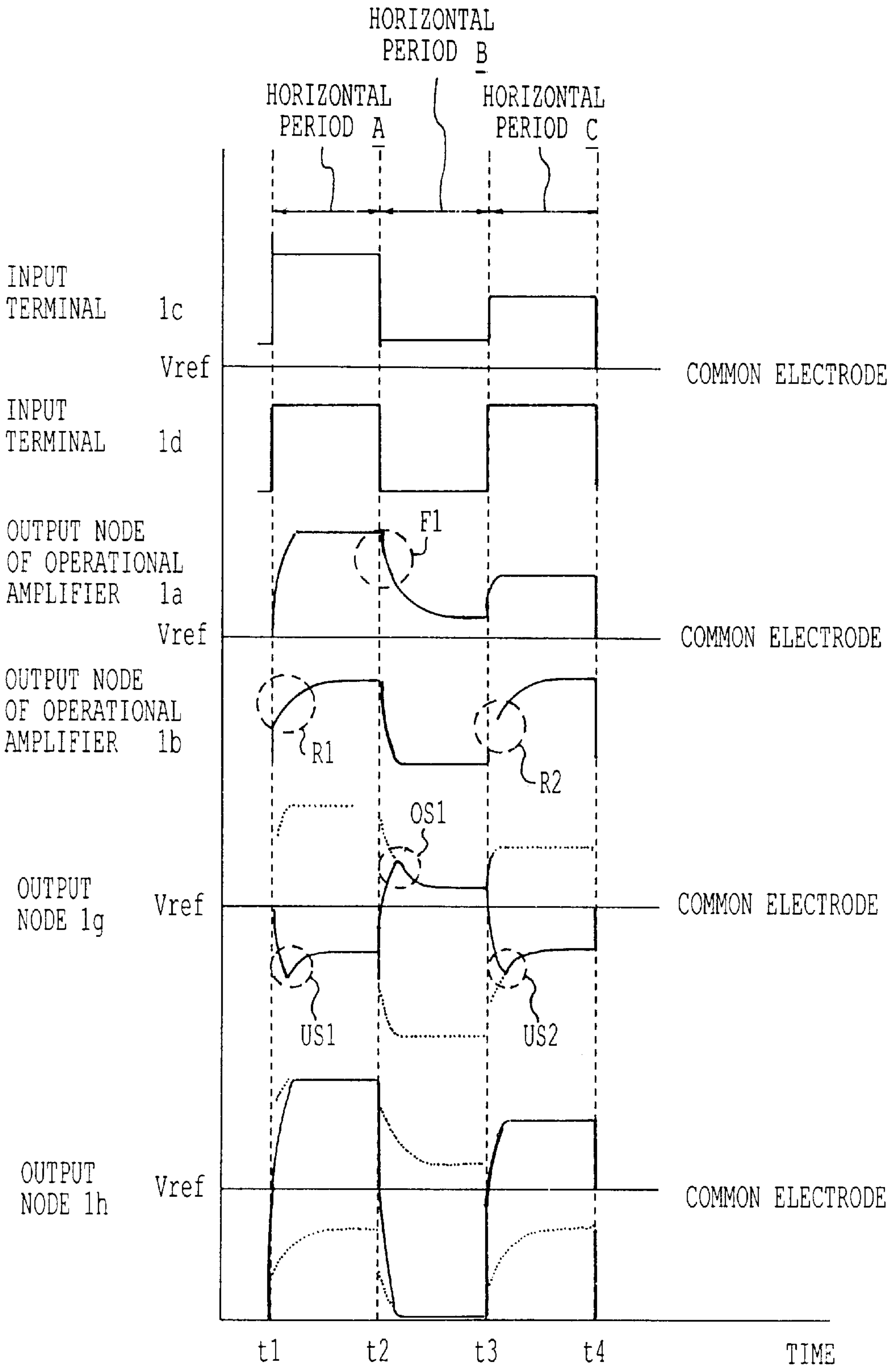
FIG. 5 (Prior Art)
FIG. 5 is a timing chart showing the circuit behavior of the prior art output circuit.

The operational amplifiers 11*f*/21*c* and 11*g*/21*d* may have circuit configurations different from those shown in FIGS. 3 and 4.

What is claimed is:

1. An output circuit comprising:

a first operational amplifier including a first output node, a first non-inverted node supplied with a positive potential level with respect to a reference voltage and a first inverted node connected to said first output node, regulating the potential level at said first output node to the potential level at said first non-inverted node through a differential amplification between said first inverted node and said first non-inverted node, and having first voltage regulating characteristics fast in potential rise at said first output node and slow in potential decay at said first output node;

a second operational amplifier including a second output node, a second non-inverted node supplied with a negative voltage with respect to said reference voltage and a second inverted node connected to said second output node, regulating the potential level at said second output node to the potential level at said second non-inverted node through a differential amplification between said second inverted node and said second non-inverted node, and having second voltage regulating characteristics fast in potential decay at said second output node and slow in potential rise at said second output node;

a first switching unit having first input nodes respectively connectable to said first output node and said second output node, a third output node and a fourth output node, and alternately connecting each of said first input nodes to said third output node and said fourth output node; and a reset circuit provided for said first operational amplifier and said second operational amplifier, and forcibly resetting said first non-inverted node, said second non-inverted node, said first output node and said second output node to said reference voltage when said first switching unit changes the connections between said first input nodes and said third and fourth output nodes.

2. The output circuit as set forth in claim 1, in which said third output node and said fourth output node are respectively connected to a first data line connected to a first group of pixels incorporated in an array of pixels and a second data line adjacent to said first data line and connected to a second group of pixels also incorporated in said array of pixels, and said first data line, said second data line, wherein other data lines and said array of pixels form a liquid crystal display panel together with gate lines for periodically selecting pixels from said array of pixels.

3. The output circuit as set forth in claim 1, further comprising a gradation voltage generator operative to generate a plurality of positive voltage levels containing said positive voltage level and a plurality of negative voltage levels containing said negative voltage level, and a selector having second input nodes connected to said gradation voltage generator and fifth output nodes for supplying said positive voltage and said negative voltage to said first non-inverted node and said second non-inverted node, respectively, and responsive to an image carrying signal for selecting said positive voltage level and said negative voltage level from said plurality of positive voltage levels and said plurality of negative voltage levels.

4. The output circuit as set forth in claim 3, in which said reset circuit includes a second switching unit having third input nodes respectively connected to said fifth output node, sixth output nodes respectively connected to said first non-inverted node and said second non-inverted node and a first reset node supplied with said reference voltage level and responsive to a control signal for selectively connecting said third input nodes and said first reset node to said sixth output nodes, and a third switching unit having fourth input nodes connected to said first output node and said second output node, respectively, seventh output nodes respectively connected to said first input nodes and a second reset node supplied with said reference voltage level and responsive to said control signal for selectively connecting said fourth input nodes to said seventh output nodes and said second reset node.

5. The output circuit as set forth in claim 4, in which said first switching unit changes the electrical connections between said first input nodes and said third and fourth output nodes at intervals, and said first reset node and said second reset node are respectively connected to said sixth output nodes and said fourth input nodes for a reset time period less than 15 percent of each of said intervals.

6. The output circuit as set forth in claim 4, in which said first switching unit changes the electrical connections between said first input nodes and said third and fourth output nodes at intervals of 15 microseconds to 30 microseconds, and said first reset node and said second reset node are respectively connected to said sixth output nodes and said fourth input nodes for a reset time period ranging from 1 microsecond to 2 microseconds.

7. The output circuit as set forth in claim 4, in which said first operational amplifier includes a first differential amplifier connected between a first power supply line and a second power supply line lower in potential level than said first power supply line and responsive to a first potential difference between said first inverted node and said first non-inverted node for producing an output signal representative of the magnitude of said first potential difference and a first output driver responsive to said output signal of said first differential amplifier for charging a first capacitive load coupled to said first output node from said first power supply line and discharging an accumulated charge from said first capacitive load through a first constant current source to said second power supply line, and said second operational amplifier includes a first differential amplifier connected between said first power supply line and said second power supply line and responsive to a second potential difference between said second inverted node and said second non-inverted node for producing an output signal representative of the magnitude of said second potential difference and a second output driver responsive to said output signal of said second differential amplifier for charging a second capacitive load coupled to said second output node from said first power supply line through a second constant current source and discharging an accumulated charge from said second capacitive load to said second power supply line.

8. The output circuit as set forth in claim 3, in which said reset circuit includes a second switching unit having third input nodes respectively supplied with said plurality of positive voltage levels and said plurality of negative voltage levels, sixth output nodes respectively connected to said second input nodes and a first reset node supplied with said reference voltage level and responsive to a control signal for selectively connecting said third input nodes and said first reset node to said sixth output nodes, and a third switching unit having fourth input nodes connected to said first output node and said second output node, respectively, seventh output nodes respectively connected to said first input nodes and a second reset node supplied with said reference voltage level and responsive to said control signal for selectively connecting said fourth input nodes to said seventh output nodes and said second reset node.

9. The output circuit as set forth in claim 8, in which said first switching unit changes the electrical connections between said first input nodes and said third and fourth output nodes at intervals, and said first reset node and said second reset node are respectively connected to said sixth output nodes and said fourth input nodes for a reset time period less than 15 percent of each of said intervals.

10. The output circuit as set forth in claim 8, in which said first switching unit changes the electrical connections between said first input nodes and said third and fourth output nodes at intervals of 15 microseconds to 30 microseconds, and said first reset node and said second reset node are respectively connected to said sixth output nodes and said fourth input nodes for a reset time period ranging from 1 microsecond to 2 microseconds.

* * * * *